(12) United States Patent
Lin et al.

(10) Patent No.: US 9,844,799 B2
(45) Date of Patent: Dec. 19, 2017

(54) COATING METHODS

(71) Applicant: GENERAL ELECTRIC COMPANY, Schenectady, NY (US)

(72) Inventors: Dechao Lin, Greer, SC (US); David Vincent Bucci, Simpsonville, SC (US)

(73) Assignee: General Electric Company, Schenectady, NY (US)

(*) Notice: Subject to any disclaimer, the term of this patent is extended or adjusted under 35 U.S.C. 154(b) by 188 days.

(21) Appl. No.: 14/971,694

(22) Filed: Dec. 16, 2015

(65) Prior Publication Data

US 2017/0175552 A1 Jun. 22, 2017

(51) Int. Cl.
| | |
|---|---|
| *F01D 5/28* | (2006.01) |
| *C23C 14/14* | (2006.01) |
| *C23C 26/00* | (2006.01) |
| *F02C 7/12* | (2006.01) |
| *F01D 9/04* | (2006.01) |
| *F01D 9/02* | (2006.01) |
| *F01D 25/12* | (2006.01) |
| *F23R 3/00* | (2006.01) |
| *C23C 14/24* | (2006.01) |
| *F01D 5/18* | (2006.01) |
| *B05D 7/22* | (2006.01) |

(52) U.S. Cl.
CPC ............. *B05D 7/22* (2013.01); *C23C 14/14* (2013.01); *C23C 14/24* (2013.01); *C23C 26/00* (2013.01); *F01D 5/18* (2013.01); *F01D 5/288* (2013.01); *F01D 9/023* (2013.01); *F01D 9/041* (2013.01); *F01D 25/12* (2013.01); *F02C 7/12* (2013.01); *F23R 3/002* (2013.01); *F05D 2220/32* (2013.01); *F05D 2230/90* (2013.01); *F05D 2240/35* (2013.01); *F05D 2300/611* (2013.01)

(58) Field of Classification Search
CPC ....................................................... B05D 7/22
USPC .................................................. 427/230–239
See application file for complete search history.

(56) References Cited

U.S. PATENT DOCUMENTS

| | | |
|---|---|---|
| 4,132,816 A | 1/1979 | Benden et al. |
| 4,347,267 A | 8/1982 | Baldi |
| 4,904,501 A | 2/1990 | Davis |
| 5,041,309 A | 8/1991 | Davis et al. |
| 5,928,725 A | 7/1999 | Howard et al. |
| 7,026,011 B2 | 4/2006 | Wustman et al. |
| 7,700,154 B2 | 4/2010 | Olson |
| 8,916,005 B2 | 12/2014 | Cavanaugh et al. |
| 2007/0125459 A1 | 6/2007 | Gupta et al. |

OTHER PUBLICATIONS

EPO Search Report, dated May 17, 2017, 12 pages.

*Primary Examiner* — William P Fletcher, III
(74) *Attorney, Agent, or Firm* — McNees Wallace & Nurick LLC

(57) ABSTRACT

A coating method is disclosed including disposing a coating composition into a fluidly communicating space defined by an internal surface of an article. The fluidly communicating space includes at least one aperture, which is sealed, forming an enclosed space. The internal surface and the coating composition are heated under autogenous pressure, coating the internal surface with the coating composition. The at least one aperture is unsealed, re-forming the fluidly communicating space. Another coating method is disclosed in which the coating composition is disposed into a reservoir which is connected in fluid communication with the enclosed space prior to heating under autogenous pressure, coating the internal surface with the coating composition. Yet another coating method is disclosed in which the coating composition and the article are disposed in a vessel, which is sealed, forming the enclosed space prior to heating under autogenous pressure, coating the internal surface with the coating composition.

20 Claims, 3 Drawing Sheets

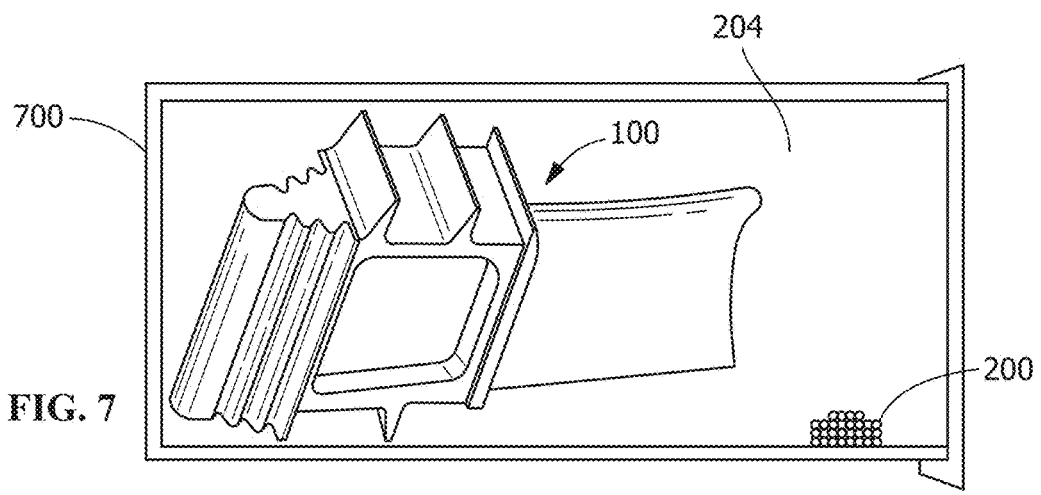
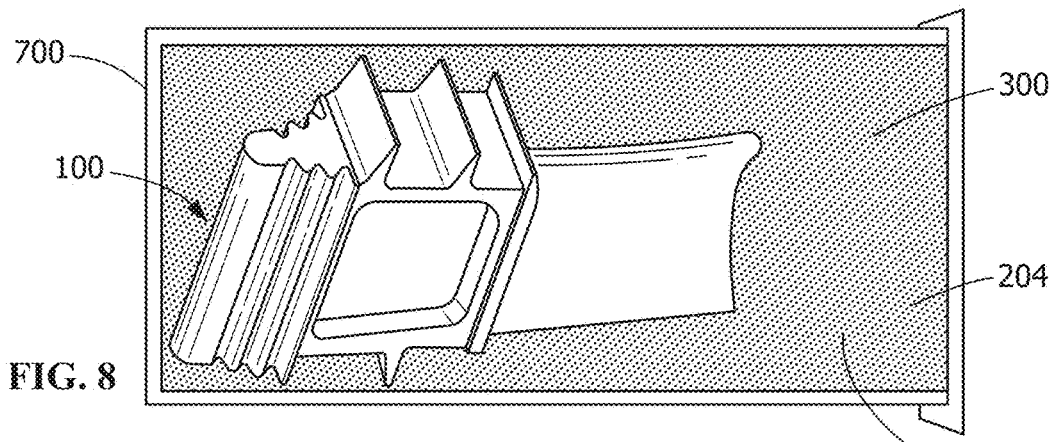
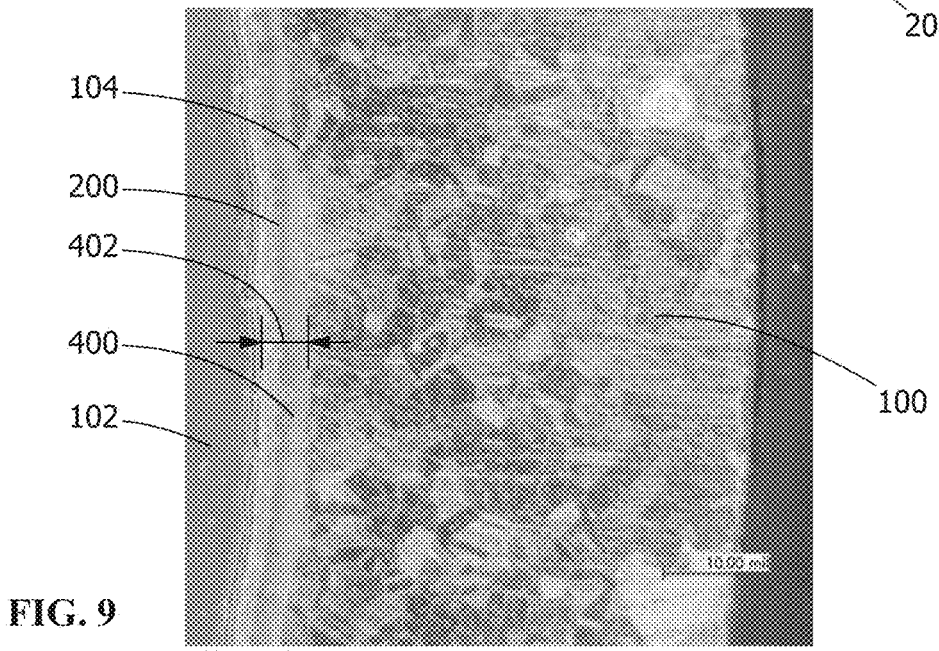

COATING METHODS

FIELD OF THE INVENTION

The present invention is directed to coating methods. More particularly, the present invention is directed to coating methods for coating an internal surface of an article under autogenous pressure.

BACKGROUND OF THE INVENTION

Gas turbines are continuously being modified to increase efficiency and decrease cost. One method for increasing the efficiency of a gas turbine includes increasing the operating temperature. Increases in operating temperature result in more extreme operating conditions which has led to the development of coating systems designed to increase the heat tolerance of the turbine components and protect the turbine components from reactive gases in the hot gas path of the gas turbine. The temperature tolerance of a turbine component may also be increased through the use of cooling channels. Cooling channels are also coated to increase heat tolerance and protect from reactive gases in the hot gas path.

Coating the internal surfaces of cooling channels and other internal surfaces within a gas turbine component may be complicated by factors such as small apertures accessing the internal channels of the component, which may be easily blocked by coating residue. Removal of such blockages is difficult and costly. Further, current coating methods are inefficient, wasting significant amounts of coating material, may require the use of argon, which increases cost, and may contaminate furnace chambers used in the coating process with the coating material, requiring periodic decontamination.

BRIEF DESCRIPTION OF THE INVENTION

In an exemplary embodiment, a coating method includes disposing a coating composition into a fluidly communicating space defined by an internal surface of an article. The fluidly communicating space includes at least one aperture. The at least one aperture is sealed, forming an enclosed space. The internal surface and the coating composition are heated under autogenous pressure, coating the internal surface with the coating composition. The at least one aperture is unsealed, re-forming the fluidly communicating space.

In another exemplary embodiment, a coating method includes sealing at least one aperture of a fluidly communicating space defined by an internal surface of an article, forming an enclosed space. A coating composition is disposed into a reservoir. The enclosed space is connected in fluid communication with the reservoir. The reservoir, the internal surface and the coating composition are heated under autogenous pressure, coating the internal surface with the coating composition. The at least one aperture is unsealed, re-forming the fluidly communicating space.

In another exemplary embodiment, a coating method includes disposing a coating composition and an article in a vessel. The article includes at least one fluidly communicating space defined by at least one internal surface of the article. The vessel is sealed, forming an enclosed space. The at least one internal surface and the coating composition are heated under autogenous pressure, coating the at least one internal surface with the coating composition. The vessel is unsealed and the article is removed.

Other features and advantages of the present invention will be apparent from the following more detailed description of the preferred embodiment, taken in conjunction with the accompanying drawings, which illustrate, by way of example, the principles of the invention.

BRIEF DESCRIPTION OF THE DRAWINGS

FIG. 7 is a schematic view of a turbine blade sealed in a vessel with a coating compound, according to an embodiment of the present disclosure.

FIG. 8 is a schematic view of the article of FIG. 7, during heating, according to an embodiment of the present disclosure.

FIG. 9 is a micrograph of a coating produced under autogenous pressure according to an embodiment of the present disclosure.

Wherever possible, the same reference numbers will be used throughout the drawings to represent the same parts.

DETAILED DESCRIPTION OF THE INVENTION

Provided are exemplary coating methods. Embodiments of the present disclosure, in comparison to methods not utilizing one or more features disclosed herein, improve process efficiency, decrease blockages, decrease waste, decrease costs, increase coating uniformity, decrease coating time, decrease furnace contamination, or a combination thereof.

Figure 1:
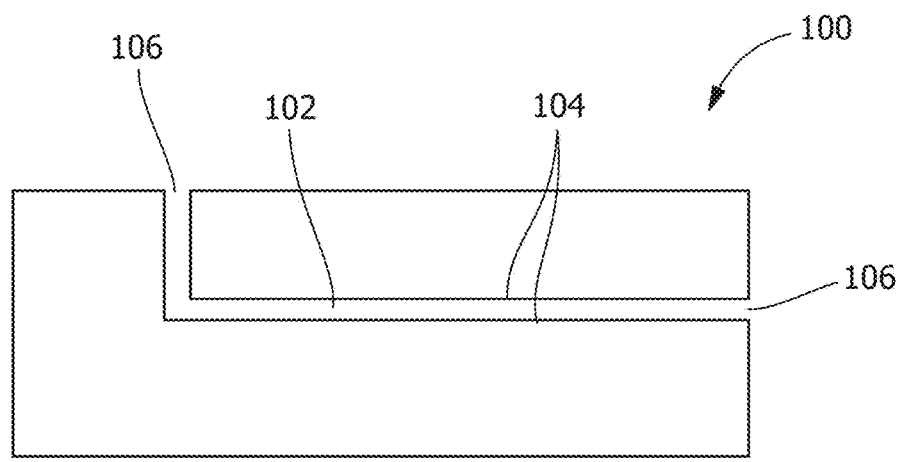
FIG. 1 is a sectioned view of an article including a fluidly communicating space defined by an internal surface, according to an embodiment of the present disclosure.

Referring to FIG. 1, in one embodiment, a coating method is provided for an article 100 including a fluidly communicating space 102 defined by an internal surface 104 of the article. The fluidly communicating space 102 includes at least one aperture 106. The article 100 may be any suitable article, including, but not limited, a turbine component, such as, but not limited to, a hot gas path component, a bucket (blade) (see FIGS. 7 and 8), a nozzle (vane), a shroud, a combustor, a combustor liner, a combustion transition piece, or a combination thereof. The fluidly communicating space 102 may be any suitable space, including, but not limited to, a cooling channel, a fluid transfer line, a fuel line, a fluid reservoir, or a combination thereof. The internal surface 104 may include surface features such as turbulators, including, but not limited to, pins, pin banks, fins, bumps, and surface textures.

The at least one aperture may include any suitable diameter, including, but not limited to, at least about 0.001 inches, alternatively at least about 0.01 inches, alternatively between about 0.005 inches to about 0.1 inches, alternatively between about 0.01 inches to about 0.06 inches, alternatively less than about 0.5 inches, alternatively less than about 0.1 inches, alternatively less than about 0.06 inches.

The internal surface 104 may be the surface of a substrate of the article 100 or a coating disposed on the article 100, such as, but not limited to a MCrAlY coating, and may include any suitable material, including, but not limited to, a metal, an alloy, an iron-based alloy, a ceramic, a steel, a MCrAlY, a thermal barrier coating, a bond coating, an environmental barrier coating, a fiber glass composite, a carbon composite, a refractory alloy, a superalloy, a nickel-based superalloy, an iron-based superally, a cobalt-based superalloy, a ceramic matrix composite, a carbon-fiber-reinforced carbon (C/C), a carbon-fiber-reinforced silicon carbide (C/SiC), a silicon-carbide-fiber-reinforced silicon carbide (SiC/SiC), or a combination thereof.

Figure 2:
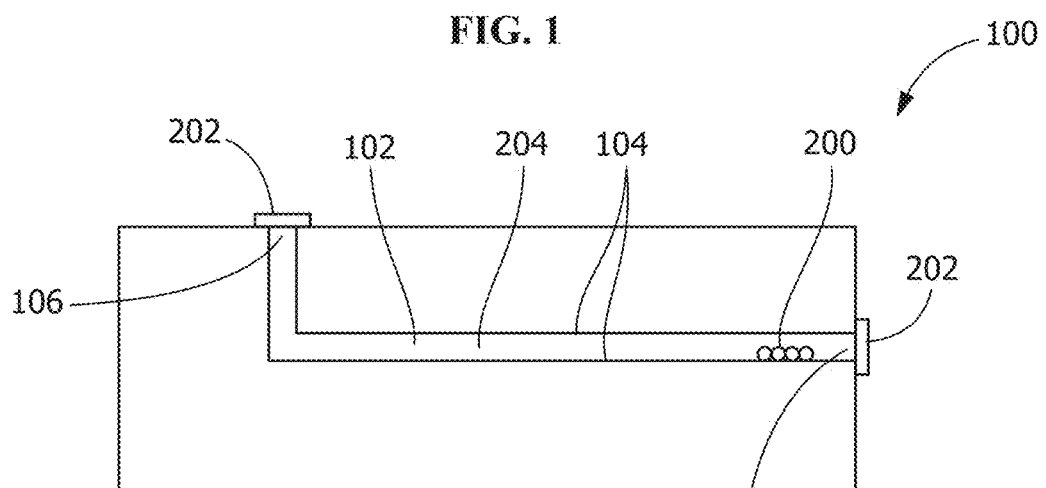
FIG. 2 is a sectioned view of the article of FIG. 1, following introduction of a coating compound and sealing of the fluidly communicating space into an enclosed space, according to an embodiment of the present disclosure.

Referring to FIG. 2, in one embodiment, a coating composition 200 is disposed into the fluidly communicating space 102, and the at least one aperture 106 is sealed. The coating composition 200 may be in any suitable form, including, but not limited to, a cement pack, a slurry, a powder, a gel, a paste, a tape, or a combination thereof. The coating composition may include any suitable material, including, but not limited to, aluminum. In one embodiment, the coating composition includes a slurry having a donor material containing metallic aluminum, a halide activator, and a binder containing an organic polymer. The donor material may include an aluminum alloy such as, but not limited to, aluminum, alloyed with chromium, cobalt, iron, or a combination thereof. The halide activator may include ammonium chloride, ammonium fluoride, ammonium bromide, or a combination thereof. The binder may include an alcohol-based organic polymer, a water-based organic polymer, or a combination thereof.

The coating composition 200 may be dried prior to sealing the at least one aperture 106. Sealing the at least one aperture 106 may include any suitable sealing technique, including, but not limited to, attaching a seal 202 such as a cap, a plug to the article 100 covering the at least one aperture. Attaching may further include any suitable attachment technique, including, but not limited to, adhering with an adhesive, welding, brazing, brazing a pre-sintered preform, or a combination thereof. Sealing the at least one aperture 106 forms an enclosed space 204 from the fluidly communicating space 102.

In one embodiment, the fluidly communicating space 102 is evacuated prior to sealing the at least one aperture 160. In another embodiment, the fluidly communicating space 102 is filled with an inert atmosphere prior to sealing the at least one aperture 106. The inert atmosphere may be any suitable gas, including, but not limited to, nitrogen, helium, argon, or a combination thereof.

Figure 3:
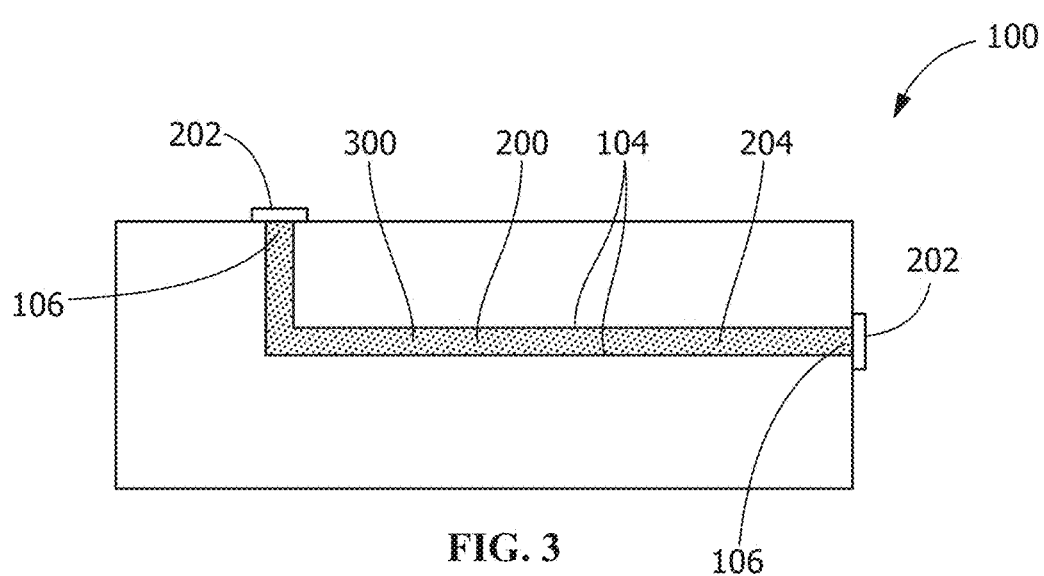
FIG. 3 is a sectioned view of the article of FIG. 2, during heating, according to an embodiment of the present disclosure.

Referring to FIG. 3, in one embodiment, the internal surface 104 and the coating composition 200 are heated under autogenous pressure, vaporizing the coating composition 200 to a coating gas 300 and distributing the coating gas 300 throughout the enclosed space 204. The internal surface 104 and the coating composition 200 may be heated to any suitable temperature and for any suitable duration. In one embodiment, the internal surface 104 and the coating composition 200 are heated to a temperature of at least about 1,200° F., alternatively at least about 1,500° F., alternatively at least about 1,800° F., alternatively between about 1,200° F. and about 2,400° F., alternatively between about 1,500° F. and about 2,100° F. In one embodiment, the internal surface 104 and the coating composition 200 are heated for less than about one hour, alternatively less than about two hours, alternatively less than about three hours, alternatively less than about four hours, alternatively between one hour and about four hours, alternatively between about two and about three hours.

Figure 4:
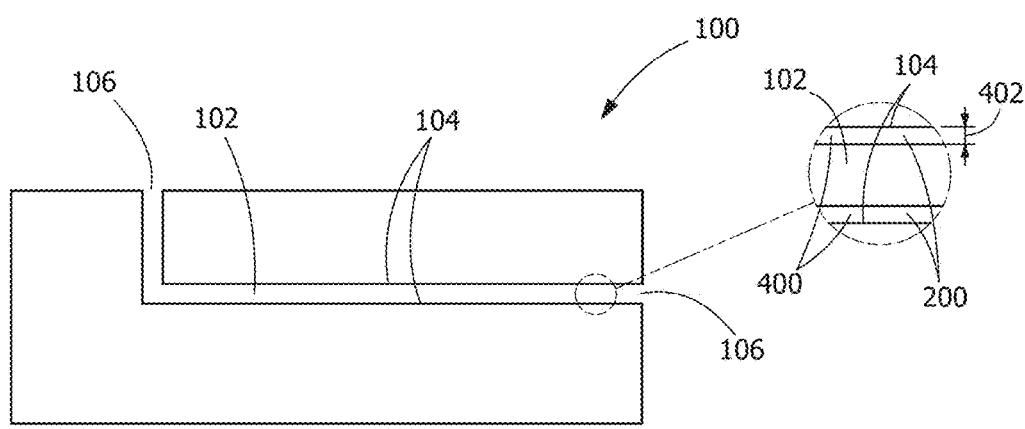
FIG. 4 is a sectioned view of the article of FIG. 3, following cooling and unsealing of the fluidly communicating space, according to an embodiment of the present disclosure.

Referring to FIG. 4, in one embodiment, the internal surface 104 and the coating composition 200 are cooled, depositing the coating composition 200 on the internal surface 104, forming a coating 400 on the internal surface 104. The at least one aperture 106 is unsealed, reforming the fluidly communicating space 102. The coating may include any suitable coating thickness 402, including, but not limited to, at least about 0.001 inches, alternatively at least about 0.002 inches, alternatively at least about 0.003 inches, alternatively about 0.008 inches, alternatively between about 0.001 inches and about 0.02 inches, alternatively between about 0.002 inches and about 0.016 inches, alternatively between about 0.003 inches and about 0.012 inches.

Figure 5:
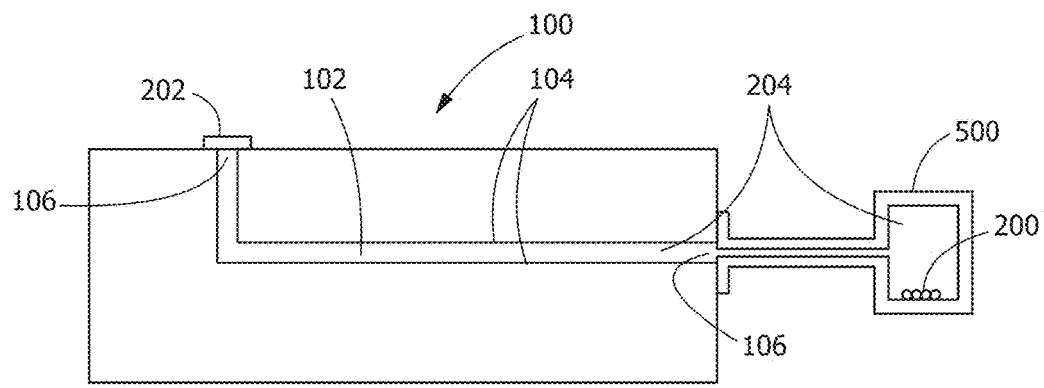
FIG. 5 is a sectioned view of the article of FIG. 1, following sealing of the fluidly communicating space into an enclosed space and connection to a reservoir including a coating compound, according to an embodiment of the present disclosure.

Referring to FIG. 5, in another embodiment, the coating composition 200 is disposed into a reservoir 500, and the reservoir 500 is sealed to the at least one aperture 106 of the fluidly communicating space 102, forming the enclosed space 204. The fluidly communicating space 102 and the reservoir 500 are in fluid communication with one another.

Figure 6:
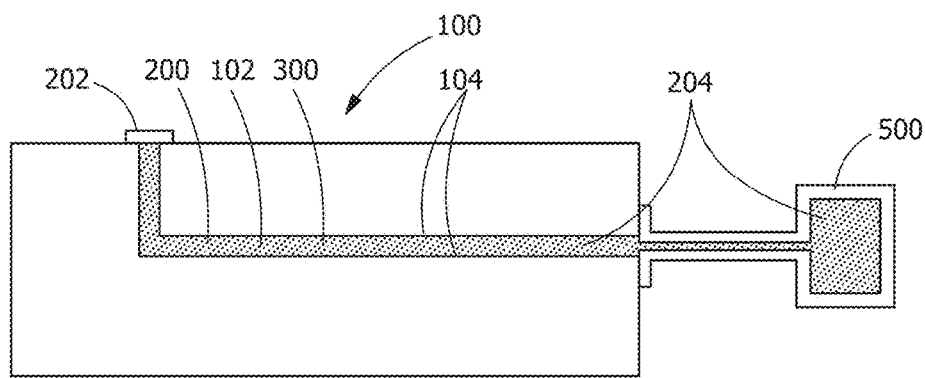
FIG. 6 is a sectioned view of the article of FIG. 5, during heating, according to an embodiment of the present disclosure.

Referring to FIG. 6, in a further embodiment, the internal surface 104, the reservoir 500, and the coating composition 200 are heated under autogenous pressure, vaporizing the coating composition 200 to a coating gas 300 and distributing the coating gas 300 throughout the enclosed space 204. The internal surface 104, the reservoir 500, and the coating composition 200 may be heated to any suitable temperature and for any suitable duration. Referring again to FIG. 4, the internal surface 104, the reservoir 500, and the coating composition 200 may be cooled, and the reservoir 500 removed, depositing the coating composition 200 on the internal surface 104, forming the coating 400 on the internal surface.

Referring again to FIG. 6, in one embodiment, the reservoir 500 and the internal surface 104 are cooled at the same rate. In another embodiment, the reservoir 500 is differentially cooled from the internal surface 104. The reservoir 500 may be cooled at a faster rate relative to the internal surface 104 or a slower rate relative to the internal surface 104. Without being bound be theory, it is believed that cooling the reservoir 500 and the internal surface 104 at the same rate may result in an even distribution of the coating composition 200 on both the reservoir 500 and the internal surface 104. Cooling the reservoir 500 at a faster rate relative to the internal surface 104 may cause the coating composition 200 to be preferentially deposited in the reservoir, and cooling the reservoir 500 at a slower rate relative to the internal surface 104 may cause the coating composition 200 to be preferentially deposited on the internal surface 104.

Referring to FIG. 7, in yet another embodiment, the article 100 and the coating composition 200 are disposed in a vessel 700. The vessel 700 is sealed, forming an enclosed space 204.

Referring to FIG. 8, in a further embodiment, the vessel 700, the at least one internal surface 104, and the coating composition 200 are heated under autogenous pressure, vaporizing the coating composition 200 to a coating gas 300 and distributing the coating gas 300 throughout the enclosed space 204. The vessel 700, the at least one internal surface 104, and the coating composition 200, may be heated to any suitable temperature and for any suitable duration. The vessel 700, the at least one internal surface 104, and the coating composition 200 may be cooled, depositing the coating composition 200 and forming the coating 400 on all external surfaces of the article 100 and all internal surfaces of the article 100 which were in fluid communication with the enclosed space 204 of the vessel 700. Following coating, the vessel 700 is unsealed and the article 100 is removed from the vessel 700.

The coating composition may be dried prior to sealing the vessel. In one embodiment, the vessel 700 is evacuated prior to sealing the vessel 700. In another embodiment, the vessel 700 is filled with an inert atmosphere prior to sealing the vessel 700.

Example

Referring to FIG. 9, in one exemplary embodiment, about three grams of gel aluminide slurry was placed into a stainless steel tube (article 100), and both ends of the tube were sealed by crimping. The article 100 was heated at about 1,800° F. for about 2 hours at autogenous pressure and then cooled to room temperature. The article 100 was sectioned to permit micrographic analysis of the coating structure. The micrograph shows a coating 400 for coating composition 200 disposed on the internal surface 104 of the article 100 adjacent to the fluidly communicating space 102. The coating 400 includes a coating thickness 402 of about 0.002 inches with aluminum being about 25% by weight.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A coating method, comprising:
disposing a coating composition into a fluidly communicating space defined by an internal surface of an article, the fluidly communicating space comprising at least one aperture;
sealing the at least one aperture, forming an enclosed space;
heating the internal surface and the coating composition under autogenous pressure, vaporizing the coating composition, and coating the internal surface with the coating composition; and
unsealing the at least one aperture, reforming the fluidly communicating space.

2. The coating method of claim 1, wherein disposing the coating composition comprises disposing at least one of a cement pack, a slurry, a powder, a paste, a tape, and a gel.

3. The coating method of claim 1, wherein disposing the coating composition comprises disposing the coating composition into a turbine component.

4. The coating method of claim 3, wherein disposing the coating composition comprises disposing the coating composition into a cooling channel of the turbine component.

5. The coating method of claim 1, further comprising drying the coating composition prior to sealing the at least one aperture.

6. The coating method of claim 1, further comprising evacuating the fluidly communicating space prior to sealing the at least one aperture.

7. The coating method of claim 1, further comprising filling the fluidly communicating space with an inert atmosphere prior to sealing the at least one aperture.

8. The coating method of claim 1, wherein heating the internal surface and the coating composition under autogenous pressure comprises a heating duration of less than about four hours.

9. A coating method, comprising:
sealing at least one aperture of a fluidly communicating space defined by an internal surface of an article, forming an enclosed space;
disposing a coating composition into a reservoir;
connecting in fluid communication the enclosed space with the reservoir;
heating the reservoir, the internal surface and the coating composition under autogenous pressure, vaporizing the coating composition, and coating the internal surface with the coating composition; and
unsealing the at least one aperture, reforming the fluidly communicating space.

10. The coating method of claim 9, wherein disposing the coating composition comprises disposing at least one of a cement pack, a slurry, a powder, a paste, a tape, and a gel.

11. The coating method of claim 9, wherein sealing the at least one aperture comprises sealing the at least one aperture of a turbine component.

12. The coating method of claim 11, wherein sealing the at least one aperture comprises sealing the at least one aperture of a cooling channel of the turbine component.

13. The coating method of claim 9, wherein heating the internal surface and the coating composition under autogenous pressure comprises a heating duration of less than about four hours.

14. A coating method, comprising:
disposing a coating composition and an article in a vessel, the article comprising at least one fluidly communicating space defined by at least one internal surface of the article;
sealing the vessel, forming an enclosed space;
heating the vessel, the at least one internal surface, and the coating composition under autogenous pressure, vaporizing the coating composition, and coating the at least one internal surface with the coating composition; and
unsealing the vessel and removing the article.

15. The coating method of claim 14, wherein disposing the coating composition comprises disposing at least one of a cement pack, a slurry, a powder, a paste, a tape, and a gel.

16. The coating method of claim 14, wherein disposing the article comprises disposing a turbine component.

17. The coating method of claim 14, further comprising drying the coating composition prior to sealing the vessel.

18. The coating method of claim 14, further comprising evacuating the vessel prior to sealing the vessel.

19. The coating method of claim 14, further comprising filling the vessel with an inert atmosphere prior to sealing the vessel.

20. The coating method of claim 14, wherein heating the at least one internal surface and the coating composition under autogenous pressure comprises a heating duration of less than about four hours.

* * * * *